(12) United States Patent
Lee et al.

(10) Patent No.: US 6,197,110 B1
(45) Date of Patent: Mar. 6, 2001

(54) MASS PRODUCTION OF SILICON DIOXIDE FILM BY LIQUID PHASE DEPOSITION METHOD

(75) Inventors: Ming-Kwei Lee, Kaohsiung; Bo-Hsiung Lei, Jia-yih, both of (TW)

(73) Assignee: National Science Counsel, Taipei ( * ) Notice: Subject to any disclaimer, the term of this patent is extended or adjusted under 35 U.S.C. 154(b) by 0 days.

(21) Appl. No.: 09/302,119

(22) Filed: Apr. 29, 1999

(30) Foreign Application Priority Data

Apr. 30, 1998 (TW) .................................. 87106661

(51) Int. Cl.$^7$ .................................. C30B 19/00

(52) U.S. Cl. .................. 117/57; 117/54; 117/20; 414/936; 438/787

(58) Field of Search .................. 414/936, 938; 117/11, 17, 20, 54, 57, 61, 934; 438/787

(56) References Cited

U.S. PATENT DOCUMENTS 5,314,107 * 5/1994 d'Aragona et al. .................. 228/116
5,920,780 * 7/1999 Wu ........................ 438/301

OTHER PUBLICATIONS

Hirotsugu Nagayama, Hisao Honda and Hideo Kawahara; "A New Process for Silica Coating"; Nippon Sheet Glass Company, Limited, Central Research Laboratory, Itami 664, Japan; Aug. 1988.

Akihiro Hishinuma, Takuji Goda, Masaki Kitaoka, Shigeo Hayashi and Hideo Kawahara; "Formation of silicon dioxide films in acidic solutions"; Central Rsearch Laboratory, Nippon Sheet Glass Co., Ltd., Konoike, Itami, Hyogo, Japan; 1991—Elsevier Science Publishers B.V. (North–Holland); Aug. 1990.

* cited by examiner

Primary Examiner—Olik Chaudhuri
Assistant Examiner—Ginette Peralta
(74) Attorney, Agent, or Firm—Ellis, Venable & Busam LLP

(57) ABSTRACT

A liquid phase deposition method of mass producing substantially uniform silicon dioxide films on wafers by forming wafer sets from at least four wafers. The wafer sets are placed in a slotted polytetrafluroethylene polymer boat wherein a proper and short distance between the front surface of a wafer and another surface is created. Finally, a substantially uniform silicon dioxide film is deposited on the wafer surfaces by contacting the wafer sets with an aqueous supersaturated silicon dioxide solution comprising a mixture of hydrofluosilicic acid and boric acid.

20 Claims, 6 Drawing Sheets

20 pieces of wafer ial chip devices(abbreviated LPD-SiO$_2$).
MASS PRODUCTION OF SILICON DIOXIDE FILM BY LIQUID PHASE DEPOSITION METHOD

FIELD OF THE INVENTION

The present invention demonstrates a method of mass production technology of liquid phase deposition for the growth of silicon dioxide film (LPD-SiO$_2$). Said invention comprising a deposition system for mass production, which is "two wafers held vertically in a slotted Teflon (a polytetrafluroethylene polymer such as polymers and copolymers of tetrafluroethylene) boat" with a "proper and short distance between wafers".

BACKGROUND OF THE INVENTION

The application of silicon dioxide is widespread in integrated circuit (IC) fabrications;
(1) Silicon dioxide can be the gate oxide of metal-oxide semiconductor (MOS) devices;
(2) Silicon dioxide can be the field oxide to isolate itself from the other devices;
(3) Silicon dioxide can be the trench isolation;
(4) Silicon dioxide can be the masking for diffusion and ion implantation;
(5) Silicon dioxide can be the capping film to prevent losing impurity or composite atoms after annealing;
(6) Silicon dioxide can be the passivation film to protect the devices from the contamination of particles, dust and scratching, etc.

With the advancing development of technology, so far there are many ways of growing silicon dioxide film, such as: thermal oxidation or chemical vapor deposition (CVD). Gate oxide and field oxide are fabricated by thermal oxidation since thermal oxidation is the only way to produce high quality oxide film with low interface densities. However, these two technologies, thermal oxidation and CVD, have fabrication limitations in industrial applications including: the use of high temperatures (700° C.~1200° C.) during thermal oxidation that can easily result in the deformation of wafers and the damage to the device structure (due to the redistribution of dopants); and, in CVD, the drawbacks are its high equipment cost and growth temperature and need for more accurate control of the process conditions in mass production.

There are many ways of depositing silicon dioxide film at low temperature, such as: Plasma enhanced chemical vapor deposition (PECVD), Electron cyclotron resonance chemical vapor deposition (ECRCVD), etc. These depositions also need expensive system equipment and a growth temperature greater than 300° C. Therefore it's impossible to shorten the process flow by using photoresist as a mask. Such factors limit the flexibility of IC process design. According to the reports by H. Nagayama, et al. in *J. Electrochem. Soc.*, Vol. 135, pp. 2013 (1988) and A. Hishinuma, et al. in *Applied Surface Sci.*, Vol. 48/49, pp. 405 (1991), Liquid phase deposition (LPD-SiO$_2$) is a recently developed method of growing a silicon dioxide film. Unlike the traditional technology of growing silicon dioxide film which needs high growth temperature and expensive system equipment, the growth temperature of this technology is very low (about 40° C.), and thus preferred for modem deep-submicron IC processes. However, so far there is no technology and method proposed for the mass production process of liquid phase deposition for the growth of silicon dioxide film (LPD-SiO$_2$).

DESCRIPTION OF THE RELATED ART

Liquid phase deposition (LPD-SiO$_2$) is the recently developed method of growing silicon dioxide films. The basic method includes adding boric acid into an aqueous solution of Hydrofluosilicic Acid (H$_2$SiF$_6$) such that the solution is supersaturated with silicon dioxide, and then immersing a semiconductor wafer in the aqueous solution so that silicon dioxide deposition can occur on the wafers having individual chip devices(abbreviated LPD-SiO$_2$).

SUMMARY OF THE INVENTION

Unlike the traditional technology of depositing silicon dioxide film which needs high growth temperature and expensive system equipment, the growth temperature of the present invention is very low (about 40° C.), and also LPD-SiO$_2$ film has very good selectivity to the growth substrate. The advantages of LPD-SiO$_2$ can be summarized as follows:
(1) LPD-SiO$_2$ can deposit a uniform and high density silicon dioxide film.
(2) The growth temperature of the present invention is very low, thus the effect of high temperature to the wafers in the process can be eliminated.
(3) System equipment is cheap and simple.
(4) LPD-SiO$_2$ is selective to the photoresist, thereby IC processes can be simplified.

Since LPD-SiO$_2$ is suitable for IC fabrication, the key point of whether LPD-SiO$_2$ can be applied in IC processes depends on whether this technology can be used in mass production. However, so far there has been no in depth research or concrete methods proposed for a mass production process using liquid phase deposition for the growth of a silicon dioxide film (LPD-SiO$_2$).

The present invention proposes an effective method of applying LPD-SiO$_2$ technology in mass production. The present invention comprises a method of LPD-SiO$_2$ deposition which includes "two wafers held vertically in a slotted Teflon boat" with a "proper and short distance between wafers" such that LPD-SiO$_2$ technology can be applied even more widely.

The present invention enables LPD-SiO$_2$ technology mass production. The present invention comprises one method: "two wafers held vertically in a slotted Teflon boat" with a "proper and short distance between wafers" and "symmetry" for the mass production of wafer growth.

BRIEF DESCRIPTION OF THE INVENTION

Table I illustrates the uniformity of the thickness of a single 5 inch wafer in FIG. 2.

Table II illustrates the uniformity of the thickness of 4 pieces of 5 inch wafers in FIG. 3.

Table III illustrates the thickness of silicon dioxide versus the uniformity of relative refractive index of one single silicon wafer in one batch of the growth of 20 pieces of wafers.

Table IV illustrates the relative thickness of 20 silicon wafers in one batch of growth versus the uniformity of relative refractive index.

DESCRIPTION OF THE PREFERRED EMBODIMENTS

Figure 1:
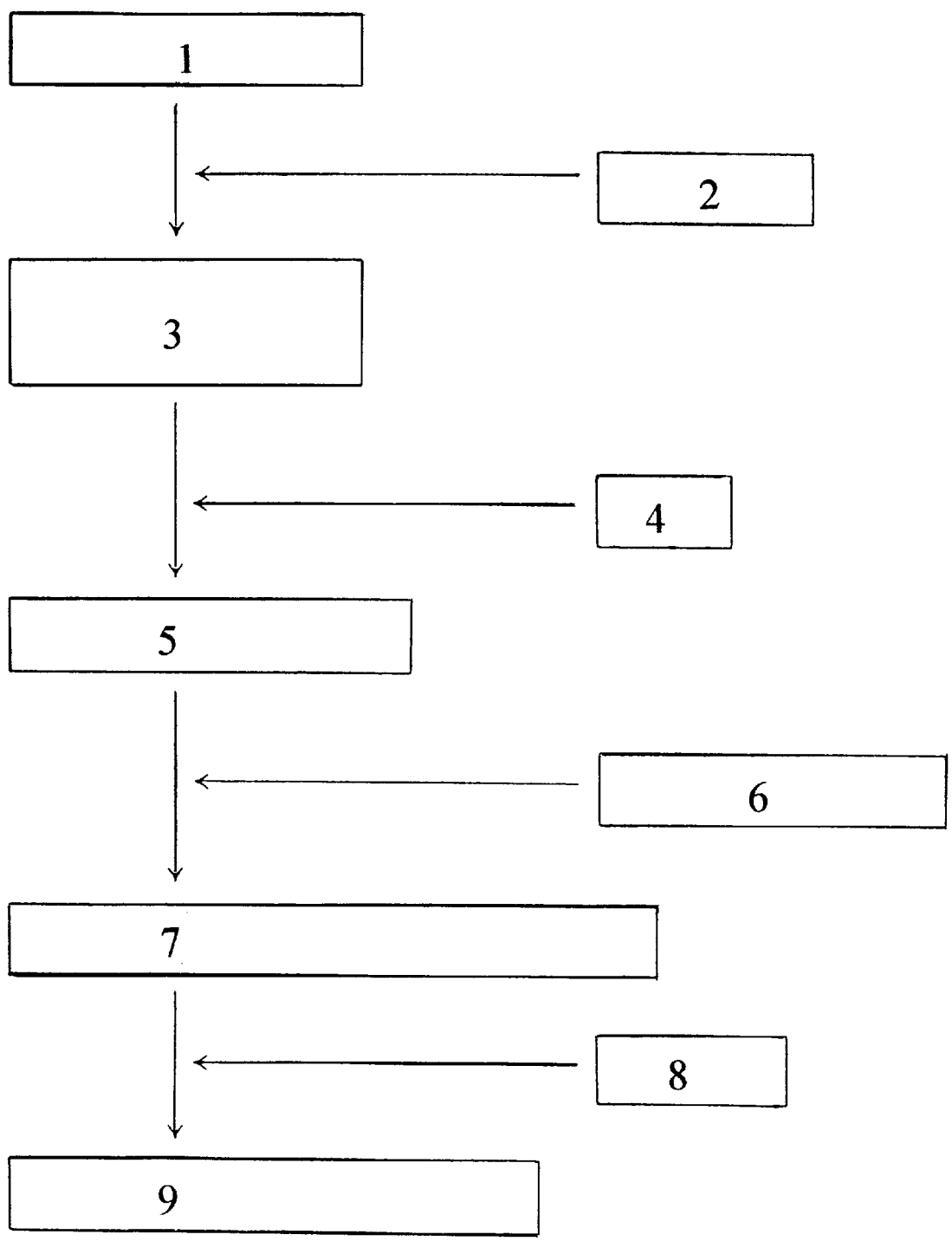
FIG. 1 is a nonlimiting block diagram showing the process flow of LPD-SiO$_2$ technology in the mass production.

The method of mass production technology of liquid phase deposition for the growth of silicon dioxide film (LPD-$SiO_2$) of the present invention comprises the method depicted in FIG. 1 for mass production of silicon dioxide growth, and wherein said "wafers held vertically" means to hold wafers vertically in a slotted Teflon boat. Preferably, said "two wafers held back to back surface" means to hold two silicon wafers with the back surface of one wafer in close contact with the back surface of the other and said "proper and short distance between wafers" means to leave a distance of 0.9 cm between wafers.

Figure 2:
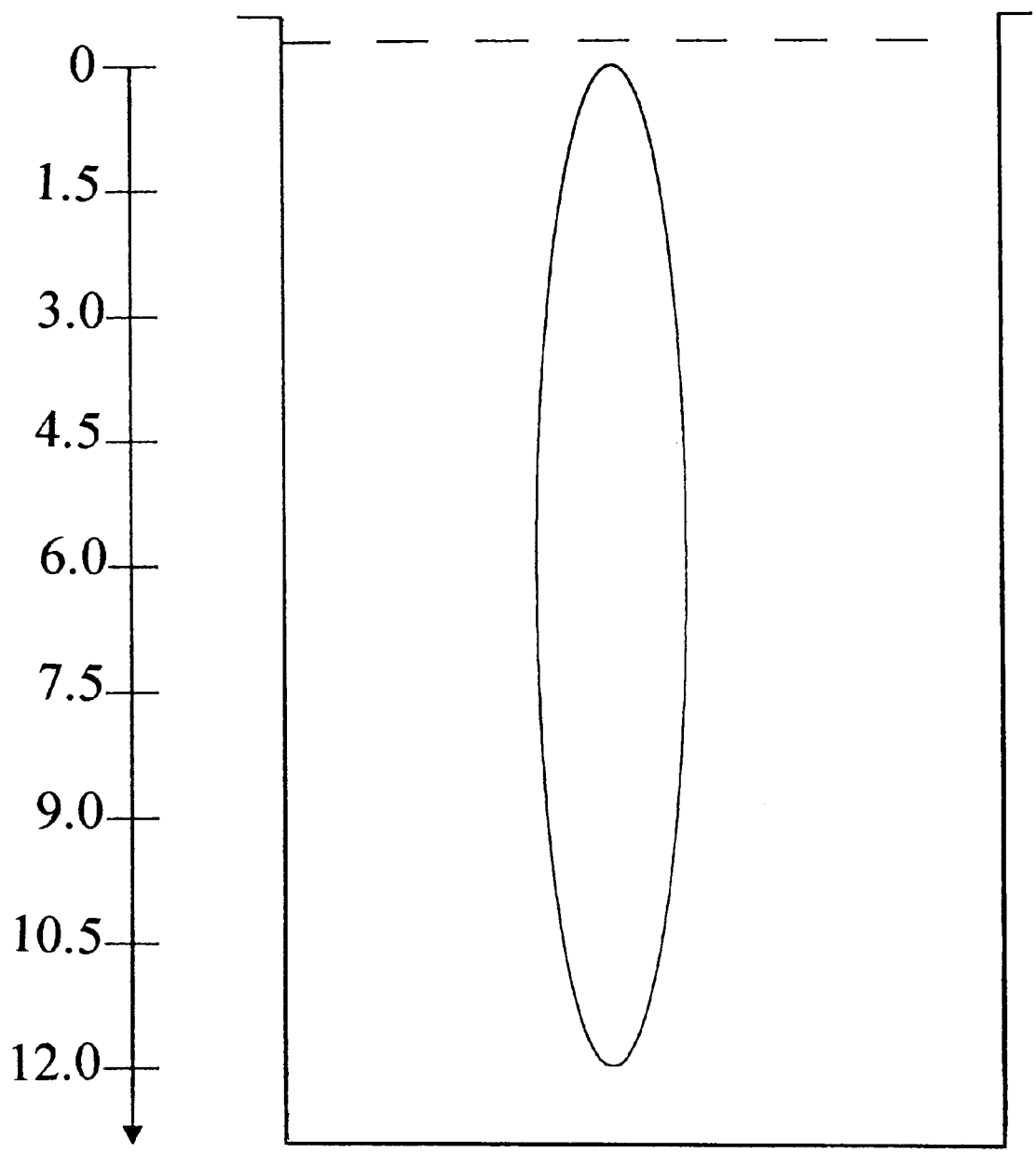
FIG. 2 is a nonlimiting diagram illustrating the side view of a single 5 inch (approximately 12.5 centimeters) wafer held vertically where the vertical scale is in centimeters.
Figure 3:
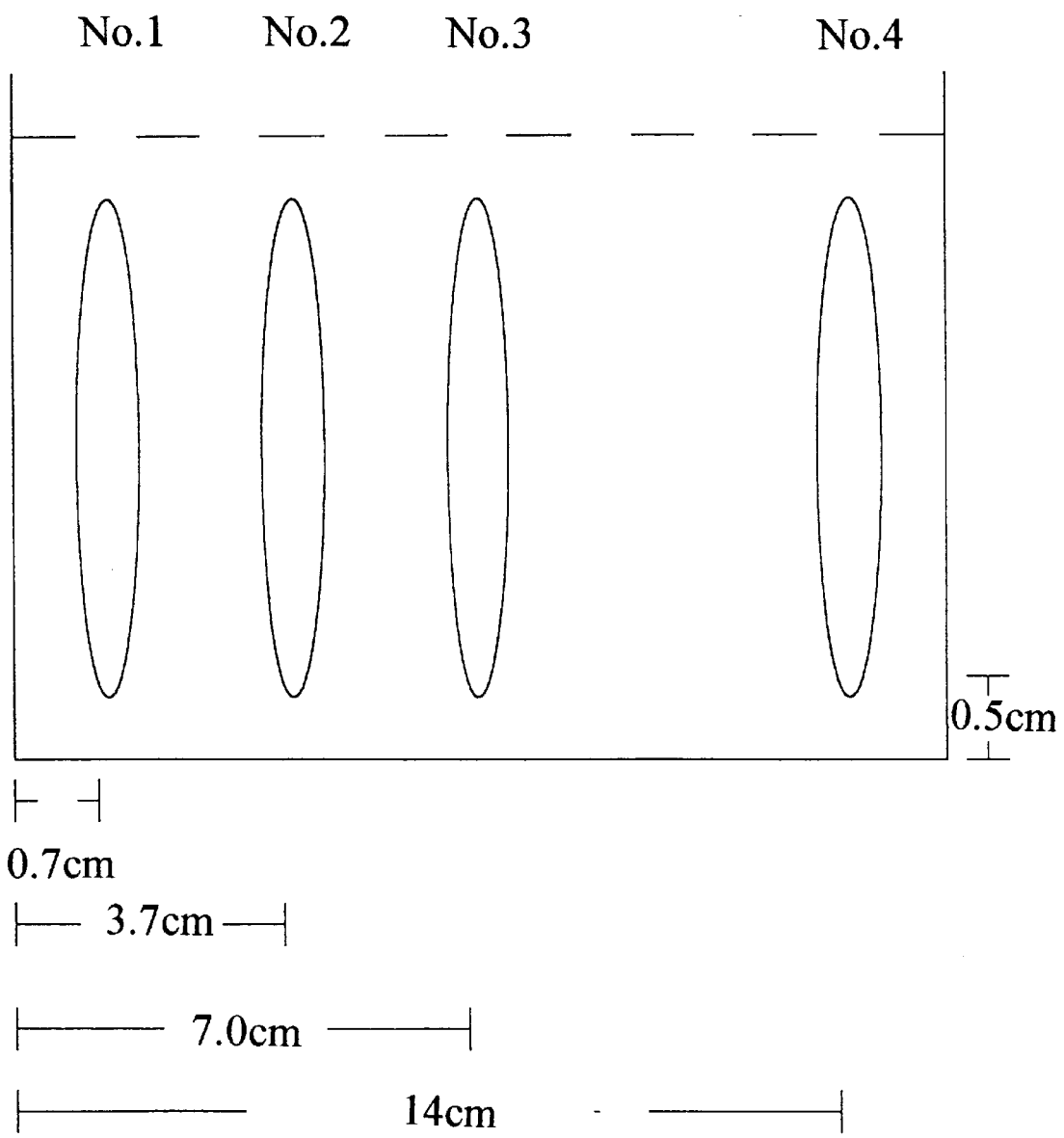
FIG. 3 is a nonlimiting diagram illustrating 4 pieces of 5 inch wafers held vertically.
Figure 6:
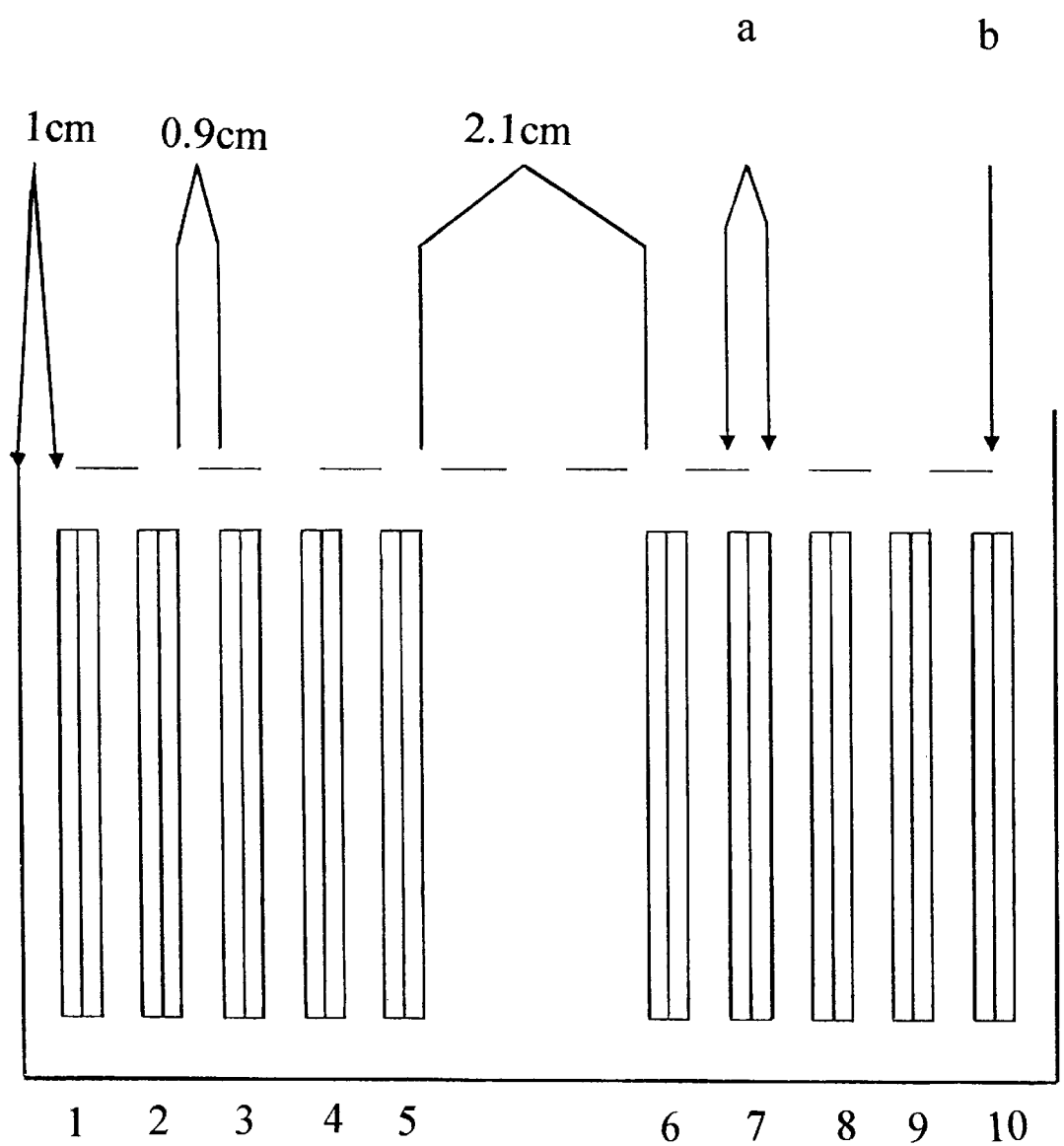
FIG. 6 is a nonlimiting diagram illustrating the position of 20 pieces of 5 inch wafers held together where (a) is a front surface of a silicon wafer and (b) are the back to back surfaces.

FIG. 2 illustrates a side view of a single 5 inch (12.5 cm) wafer held vertically where the vertical scale is in centimeters. FIG. 3 illustrates a side view of 4 pieces of 5 inch wafers that are held vertically, they are held 0.5 cm above the bottom of a Teflon boat. The first wafer is 0.7 cm from the Teflon boat end surface. The second wafer is 3.7 cm from the Teflon boat end surface. The third wafer is 7 cm from the Teflon boat end surface. The fourth wafer is 14 cm from the Teflon boat end surface. FIG. 6 illustrates a side view of 20 pieces of 5 inch wafers that are held together to form 10 sets of wafers with each wafer set containing 2 wafers. Each wafer in each set is held with the back surface of one wafer in close contact with the back surface of the other wafer and is 0.5 cm above the bottom of the Teflon boat. The first wafer is 1 cm from the Teflon boat end surface. The second and the first wafer are held with their back surfaces facing each other. Every set is spaced 0.9 cm between each other except that the fifth set is 2.1 cm from the sixth set. By adding boric acid into the aqueous solution of Hydrofluosilicic Acid ($H_2SiF_6$), the mixed solution will be super-saturated with silicon dioxide, the growth temperature of the present invention is about 40° C.

The following is the preferred embodiment of the present invention as shown in FIG. 1 to explain the contents of the technology of this patent and the improved process and principle: Adding 4 mole/l $H_2SiF_6$ 1 with silica 2, stirring for between 3 and 17 hours and filtering 3, then adding water 4 to make the concentration of $H_2SiF_6$ to be 3.56 mole/l 5, then adding 0.1 mole/l Boric acid ($H_3BO_3$) 6 to make $H_2SiF_6$ solution which contains saturated silicon dioxide 7 and adding the silicon wafer 8 to allow liquid phase deposition of silicon dioxide on the silicon wafer 9. FIG. 2 and FIG. 3 are illustrations of a single 5 inch wafer and 4 pieces of 5 inch wafers held vertically. The locations where 4 pieces of 5 inch wafers are held are indicated in the dimensions of the figure. The first piece is 0.7 cm from the edge, and the rest of them are 3.7 cm, 7.0 cm, and 14 cm, respectively.

Figure 4:
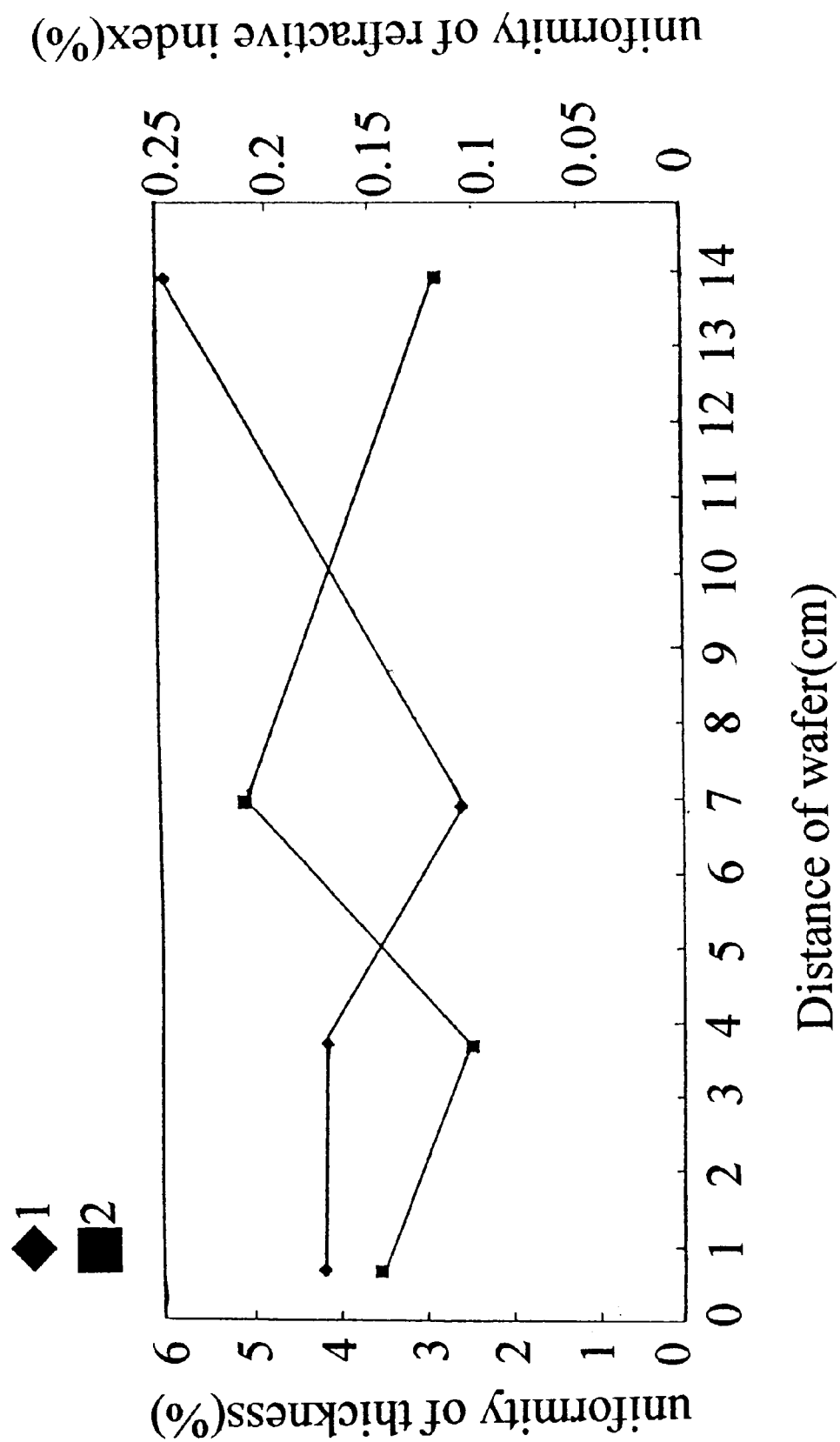
FIG. 4 is a nonlimiting diagram showing the thickness of 4 pieces of 5 inch wafers in FIG. 3 versus the relative refractive index where the diamond symbols represent (1.) the uniformity of thickness and the filled squares represent (2.) the uniformity of refractive index.

Table I and Table II are the results of uniformity of thickness in FIG. 2 and FIG. 3, the data of which are based on the uppermost edge of wafers as the reference point and correspond to the dimensions in FIG. 2. FIG. 4 is the plot of the thickness of 4 pieces of 5 inch wafers in FIG. 3 versus relative refractive index. From FIG. 4, we found that the uniformity of the thickness gets better if the spacing between wafers is shortened appropriately. Comparing Table I, Table II, and FIG. 4, we found the uniformity of a single wafer is worse than the one with 4 pieces, and also the second wafer has the best uniformity among the 4 pieces, this is because the uniformity is better due to the shorter spacings between the wafer in the middle and the two neighboring wafers on both sides of it. We propose the model of FIG. 5 to explain this phenomenon.

Figure 5:
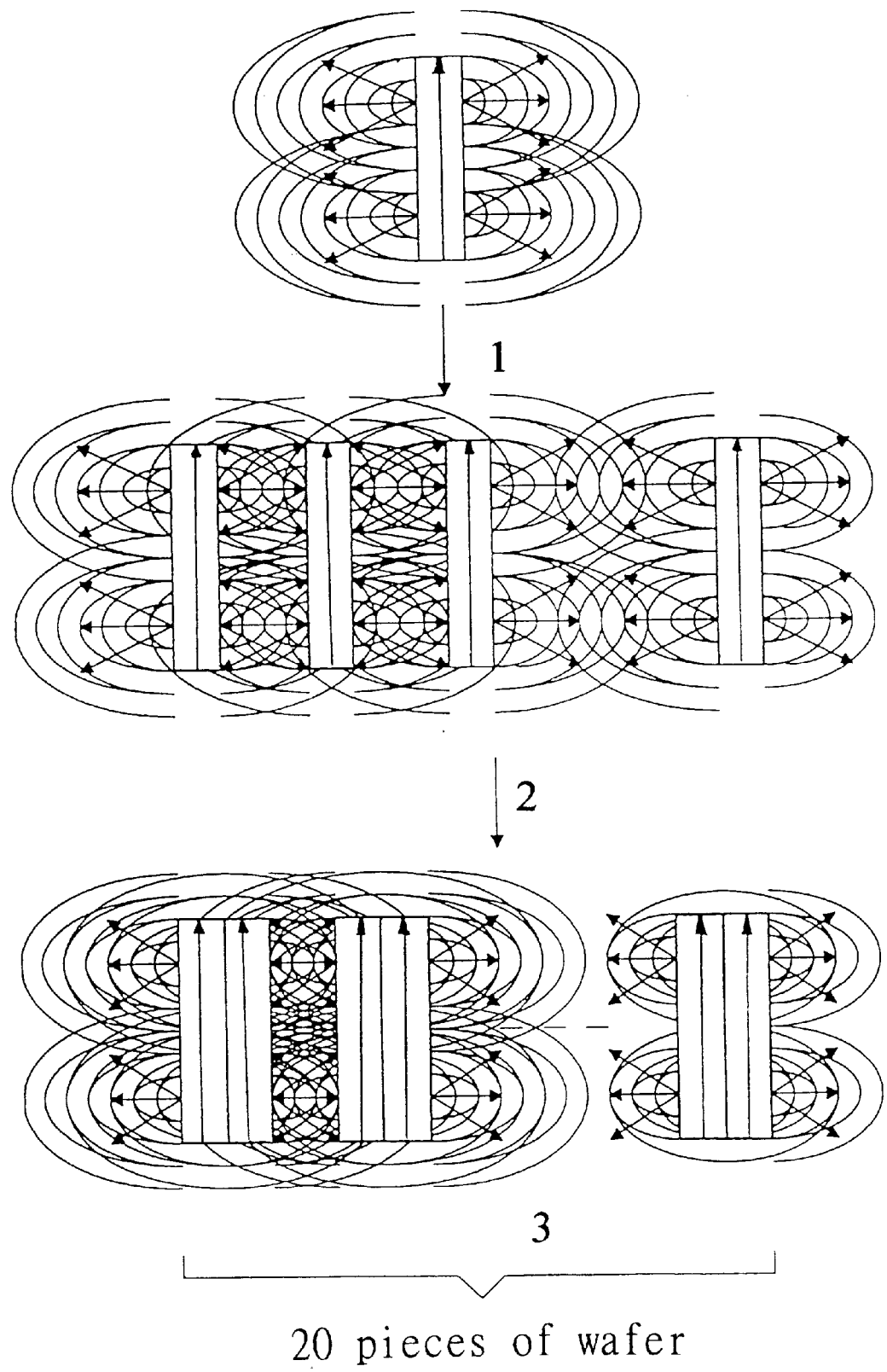
FIG. 5 is a non-limiting diagram modeling the distribution of isotherms of a single wafer piece (1.), 4 pieces of 5 inch wafers (2.), and 20 pieces of 5 inch wafers with back surface face each other (3.) held vertically.

FIG. 5 is the plot of isotherms radiated from a point heat source. As shown in the model of FIG. 5, we choose any arbitrary point on a single wafer as the point heat source, and also assume that the temperature of two point heat sources vary with the nonuniformity of the external environmental temperature. When 4 pieces of wafers are grown at the same time, the spacings between those wafers in the middle is smaller so that the high-temperature and low-temperature isotherms overlap, hence the temperature distributions of the wafers in the middle tends to be more uniform. Therefore, the effect due to normal temperature distribution of the solution or the temperature nonuniformity is larger than those wafers in the middle. This idea may be extended and applied in growing 20 pieces of 5 inch wafers in one batch and shorten the spacings between wafers appropriately.

FIG. 6 illustrates the positions where 20 pieces of 5 inch wafers are held. Two wafers are put together so that the back surface of one wafer is in close contact with the back surface of the other wafer, the spacing is 0.9 cm, the spacing in the middle is larger than 2.1 cm for measuring the spacing effect on the silicon dioxide layer uniformity. Table III and Table IV list all of the measurement results. Obviously the uniformity is even better as viewed from this data. The reason is that the spacing is shortened appropriately so the isotherms are distributed more uniformly. Also, since the wafers are held with their back surfaces in contact, the wafers have a larger thermal mass, the heat conduction improves, the effect of temperature gradient is reduced due to better heat conduction and smaller temperature differences. As shown in these embodiments, the spacings between wafers are chosen to be 3 cm, 2.1 cm in FIG. 3, or 0.9 cm in FIG. 3 and FIG. 6. Preferably, 0.9 cm is the most appropriate spacing between wafers. Further reducing the spacing will decrease the deposition rate and is not practical.

Table III is the plot of the variation in the thickness and refraction index of silicon dioxide film for each wafer which is grown in a batch of 20 pieces of wafers. The best uniformity of thickness is 1.93%, the worst of them is only 3.23%, both meet the demands of mass production.

Table IV is the plot of the wafer variation of the thickness and refractive index of silicon dioxide film in one batch of 20 pieces of wafers. The least variation in thickness of these samples is 2.1%, the most variation in thickness of these samples is only 4.7%, and both meet the demands of mass production in industry.

So the special feature in this mass production method of the present invention is:

(1) Large growth area per volume
(2) Since clean room space is usually limited, the equipment advantageously occupies a small amount of space
(3) Silicon dioxide uniformity meets the demands of mass production (4) No limitations of the number of wafers grown in one batch (5) The effect of temperature shock to facility and environment is reduced The calculation of the uniformity of thickness and relative refractive index is based on the following formula:

The uniformity of thickness=½[(Max.(relative)−Min.(relative))× 100%]/Mean

The uniformity of relative refractive index=½[Max.(relative)− Min.(relative))×100%]/Mean Max. is the thickest dimension or the largest relative refractive index of the two wafers or a single wafer.

Max. is the thinnest dimension or the smallest relative refractive index of the two wafers or a single wafer.

Mean is the average thickness or relative refractive index of the two wafers or a single wafer.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

What is claimed is:

1. A method of mass producing substantially uniform silicon dioxide films on wafer sets by liquid phase deposition, comprising:

forming the wafer sets from at least four wafers wherein each wafer has a front surface and a back surface and wherein each wafer set comprises two wafers having the back surface of one wafer held in contact with the back surface of another wafer;

placing at least two of the wafer sets in separate slots of a slotted polytetrafluroethylene polymer boat wherein at least two of the placed wafer sets each have at least one wafer front surface a proper and short distance from another surface; and contacting the placed wafer sets with an aqueous supersaturated silicon dioxide solution to deposit the substantially uniform silicon dioxide films on the wafer front surfaces.

2. The method according to claim 1, wherein the aqueous supersaturated silicon dioxide solution comprises a mixture of hydrofluosilicic acid and boric acid.

3. The method according to claim 2, wherein the slotted polytetrafluroethylene polymer boat includes at least one end surface.

4. The method according to claim 3, wherein the another surface is chosen from the group consisting of another wafer set front surface or the at least one polytetrafluroethylene polymer boat end surface.

5. The method according to claim 4, wherein the wafers are silicon wafers.

6. The method according to claim 4, wherein the wafers have a diameter of about five inches and the proper and short distance is less than about 3.0 centimeters.

7. The method according to claim 6, wherein the wafer sets are substantially vertical and the proper and short distance measures between about 0.9 and 2.1 centimeters.

8. The method according to claim 7, wherein the temperature of the aqueous supersaturated silicon dioxide solution is about 40° C.

9. A method for crating a substantially normal temperature distribution in a liquid phase solution for depositing a substantially uniform silicon dioxide film on a wafer comprising:

creating a proper and short distance between the wafer having a wafer surface and another surface chosen from the group consisting of another wafer surface or a polytetrafluroethylene polymer surface; and placing the wafer in an aqueous supersaturated silicon dioxide solution comprising hydrofluosilicic acid and boric acid to deposit the substantially uniform silicon dioxide film on the wafer surface.

10. The method according to claim 9, wherein the wafers are silicon wafers.

11. The method according to claim 10, wherein the proper and short distance between the wafer surface and the another surface is less than about 3.0 centimeters.

12. The method according to claim 9, wherein the wafers have a diameter of about five inches and the proper and short distance between the wafer surface and the another surface measures about 0.9 to 2.1 centimeters.

13. A method for creating a substantially normal temperature distribution in a liquid phase solution to deposit a substantially uniform dioxide film on wafer sets comprising:

forming the wafer set from at least four wafers wherein each wafer has a front surface and a back surface and wherein each wafer set comprises two wafers having the back surface of one wafer held in contact with the back surface of another wafer;

placing at least two of the wafer sets in separate slots of a slotted polytetrafluroethylene polymer boat wherein at least two of the placed wafer sets each have at least one wafer front surface a proper and short distance from another surface; and contacting the placed wafer sets with an aqueous supersaturated silicon dioxide solution to deposit the substantially uniform silicon dioxide films on the wafer front surfaces.

14. The method according to claim 13, wherein the aqueous supersaturated silicon dioxide solution comprises a mixture of hydrofluosilicic acid and boric acid.

15. The method according to claim 14, wherein the slotted polytetrafluroethylene polymer boat includes at least one end surface.

16. The method according to claim 15, wherein the another surface is chosen from the group consisting of wafer sets front surface or the at least one polytetrafluroethylene polymer boat end surface.

17. The method according to claim 16, wherein the wafers are silicon wafers.

18. The method according to claim 17, wherein the wafers have a diameter of about five inches and the proper and short distance is less than about 3.0 centimeters.

19. The method according to claim 18, wherein the wafer sets are substantially vertical and the proper and short distance measures between about 0.9 and 2.1 centimeters.

20. The method according to claim 19, wherein the temperature of the aqueous supersaturated silicon dioxide solution is about 40° C.

\* \* \* \* \*

UNITED STATES PATENT AND TRADEMARK OFFICE
CERTIFICATE OF CORRECTION

PATENT NO.     : 6,197,110 B1
DATED          : March 6, 2001
INVENTOR(S)    : Ming Kwei Lee and Bo-Hsiung Lei It is certified that error appears in the above-identified patent and that said Letters Patent is hereby corrected as shown below:

<u>Title page,</u>
Item [73], Assignee, "National Science Counsel" is spelled incorrectly. The correct name of the assignee is: -- National Science Council --

Signed and Sealed this

Fifth Day of August, 2003

JAMES E. ROGAN
*Director of the United States Patent and Trademark Office*